(12) United States Patent
Mitsuishi et al.

(10) Patent No.: US 6,627,320 B2
(45) Date of Patent: Sep. 30, 2003

(54) METHOD FOR PRODUCING COMPOSITION FOR VAPOR DEPOSITION, COMPOSITION FOR VAPOR DEPOSITION, AND METHOD FOR PRODUCING OPTICAL ELEMENT WITH ANTIREFLECTION FILM

(75) Inventors: Takeshi Mitsuishi, Tokyo (JP); Hitoshi Kamura, Tokyo (JP); Kenichi Shinde, Tokyo (JP); Hiroki Takei, Tokyo (JP); Akinori Kobayashi, Tokyo (JP); Yukihiro Takahashi, Tokyo (JP); Yuko Watanabe, Tokyo (JP)

(73) Assignee: Hoya Corporation, Tokyo (JP)

( * ) Notice: Subject to any disclaimer, the term of this patent is extended or adjusted under 35 U.S.C. 154(b) by 35 days.

(21) Appl. No.: 09/995,827

(22) Filed: Nov. 29, 2001

(65) Prior Publication Data

US 2002/0102414 A1 Aug. 1, 2002

(30) Foreign Application Priority Data

Nov. 30, 2000 (JP) ........................................ 2000-364928

(51) Int. Cl.$^7$ ............................ B32B 9/04; C23C 14/08; B05D 5/06; C09D 1/00
(52) U.S. Cl. .................. 428/448; 428/446; 428/697; 428/702; 427/523; 427/525; 427/527; 427/529; 427/576; 427/162; 427/163.1; 427/164; 106/286.8
(58) Field of Search .................... 106/286.1, 286.2, 106/286.4, 286.8; 427/457, 530, 529, 527, 525, 524, 523, 576, 162, 163.1, 164; 428/446, 448, 688, 689, 697, 702

(56) References Cited

U.S. PATENT DOCUMENTS

| 4,567,059 | A | * | 1/1986 | Yamaoka et al. .............. 427/79 |
| 5,181,141 | A | | 1/1993 | Sato et al. |
| 6,306,513 | B1 | | 10/2001 | Itoh et al. |
| 6,328,857 | B1 | * | 12/2001 | Anzaki et al. ......... 204/192.12 |
| 6,436,542 | B1 | * | 8/2002 | Ogino et al. ................. 428/432 |
| 6,461,686 | B1 | * | 10/2002 | Vanderstraeten ............ 427/453 |

FOREIGN PATENT DOCUMENTS

| JP | 56-116003 | | 11/1981 | |
| JP | 02-291501 | | 3/1990 | |
| JP | 02-291502 | | 3/1990 | |
| WO | WO 97/25451 | * | 7/1997 | ........... C23C/14/34 |

OTHER PUBLICATIONS

Fliedner, M. et al., "Plasma Ion Assisted Coating of Ophthalmic Optics," Society of Vacuum Coaters, Albuquerque, NM, pp. 237–241 (1995).
Copending Application No. 09/986,907.

* cited by examiner

Primary Examiner—Robert Dawson
Assistant Examiner—Michael J Feely
(74) Attorney, Agent, or Firm—Finnegan, Henderson, Farabow, Garrett & Dunner, LLP

(57) ABSTRACT

A method for producing a composition for vapor deposition comprising sintering a vapor source mixture prepared by mixing vapor sources that contain titanium dioxide and niobium pentoxide. The method is capable of forming a high-refraction layer even in low-temperature vapor deposition on a substrate. An antireflection film is formed having good scratch resistance, good chemical resistance and good heat resistance, of which the heat resistance decreases little with time, that is useful in a variety of optical elements.

19 Claims, No Drawings

METHOD FOR PRODUCING COMPOSITION FOR VAPOR DEPOSITION, COMPOSITION FOR VAPOR DEPOSITION, AND METHOD FOR PRODUCING OPTICAL ELEMENT WITH ANTIREFLECTION FILM

The present invention relates to a method for producing a composition for vapor deposition to form an antireflection film, to a composition for vapor deposition, and to a method for producing an optical element with an antireflection film. In particular, the invention relates to a method for producing a composition for vapor deposition and to a composition for vapor deposition capable of forming a high-refraction layer even in low-temperature vapor deposition, and therefore ensuring an antireflection film having good scratch resistance, good chemical resistance and good heat resistance, of which the heat resistance decreases little with time; and also relates to a method for producing an optical element having such an antireflection film.

BACKGROUND OF THE INVENTION

For improving the surface reflection characteristics of an optical element that comprises a synthetic resin, it is well known to form an antireflection film on the surface of the synthetic resin. To enhance the antireflectivity of the film, a laminate of alternate low-refraction and high-refraction is generally used. In particular, for compensating for the drawback of synthetic resins that are easy to scratch, silicon dioxide is often used for the vapor source to form low-refraction layers on the substrates, as the film formed is hard. On the other hand, zirconium dioxide, tantalum pentoxide and titanium dioxide are used for the vapor sources to form high-refraction layers on the substrates. Especially for forming an antireflection film of lower reflectivity, substances of higher refractivity are selected for the high-refraction layers of the antireflection film. For this, titanium dioxide is generally used.

However, the vapor source prepared by sintering titanium dioxide powder, when heated with electron beams for vaporizing it to be deposited on substrates, is decomposed into $TiO_{(2-x)}$ and generates oxygen gas. The thus-formed oxygen gas exists in the atmosphere around the vapor source, and oxidizes the vapor of $TiO_{(2-x)}$ from the source before the vapor reaches the substrates. Therefore, a film of little light absorption is formed on substrates from the vapor source. On the other hand, however, the oxygen gas interferes with the vapor component that runs toward the substrates, and therefore retards the film formation on the substrates. In addition, when the vapor source, prepared by sintering titanium dioxide powder, is heated with electron beams, it melts, and is therefore generally used as a liner. At this stage, the electroconductivity of the $TiO_{(2-x)}$ vapor increases, and the electrons of the electron beams applied to the vapor source therefore escape to the liner. This causes electron beam loss, and the vapor deposition system therefore requires higher power which is enough to compensate for the loss. On the other hand, when pellets only made of titanium dioxide are used for vapor deposition, the speed of film formation is low. When electron beams are applied, it was problematic in that the pellets are readily cracked.

The problem with optical elements comprising a synthetic resin is that the heating temperature in vapor deposition for the structures cannot be increased. Because of this limitation, therefore, the density of the film formed from titanium dioxide in such optical elements cannot be made satisfactorily, and the film refractivity is not satisfactorily high. In addition, the scratch resistance and the chemical resistance of the film are also not satisfactory. To compensate for the drawbacks, ion-assisted vapor deposition is generally employed, but the ion gun unit for it is expensive, therefore increasing the production costs.

Optical elements comprising a synthetic resin, especially lenses for spectacles, are generally planned so that an organic hard coat film is formed on a plastic lens substrate for improving the scratch resistance of the coated lenses, and an inorganic antireflection film is formed on the hard coat film. For spectacle lenses, new optical elements having an antireflection film of superior antireflectivity are now desired, in which the antireflection film is desired to have superior abrasion strength and good heat resistance, and its heat resistance is desired not to lower with time.

SUMMARY OF THE INVENTION

An object of the invention is to provide a method for producing a composition which is suitable for vapor deposition and to provide a composition which is suitable for vapor deposition. The advantages are such that the composition can form a high-refraction layer even on synthetic resin substrates that must be processed for vapor deposition thereon at low temperatures, within a short period of time and without using an ion gun unit or a plasma unit; not detracting from the good physical properties intrinsic to the high-refraction layer formed, that the high-refraction layer formed has high refractivity; that the antireflection film comprising the high-refraction layer formed on such synthetic resin substrates has good scratch resistance, good chemical resistance and good heat resistance, and that the heat resistance of the antireflection film decreases little with time.

Another object of the invention is to provide an optical element comprising a synthetic resin substrate with an antireflection film formed thereon, in which the antireflection film has good scratch resistance, good chemical resistance and good heat resistance, and the heat resistance of the antireflection film decreases little with time.

In our efforts to develop plastic lenses for spectacles having the above-mentioned desired properties, we have found that, when an antireflection film is formed through vapor deposition on a plastic lens substrate from a vapor source prepared by sintering a mixture of titanium dioxide and niobium pentoxide, we can attain the above-mentioned objects. Specifically, the invention provides a method for producing a composition, which comprises sintering a vapor source mixture prepared by mixing vapor sources that contain titanium dioxide and niobium pentoxide; and provides a composition that contains titanium dioxide and niobium pentoxide.

The invention also provides a method for producing an optical element with an antireflection film, which comprises vaporizing the composition and depositing the generated vapor on a substrate to form thereon a high-refraction layer of an antireflection film.

DETAILED DESCRIPTION OF THE INVENTION

A method for producing a composition for vapor deposition of the invention comprises sintering a vapor source mixture prepared by mixing vapor sources that contain titanium dioxide and niobium pentoxide. The composition of the present invention contains titanium dioxide and niobium pentoxide. The method for producing an optical element of the invention comprises vaporizing the composition and depositing the generated vapor on a substrate to form thereon a high-refraction layer of an antireflection film.

The method of the invention for preparing a composition comprises sintering a mixture containing titanium dioxide powder and niobium pentoxide powder. The powder particles may be of any suitable size, and are generally in the range of 500 nm to 4000 nm. The composition containing titanium dioxide and niobium pentoxide can be prepared by mixing titanium dioxide powder and niobium pentoxide powder. In this method, niobium pentoxide melts first as its melting point is low, and thereafter titanium dioxide melts. In the melting and vaporizing process, since the vapor pressure of the molten titanium dioxide is higher than that of the molten niobium pentoxide, the amount of titanium dioxide vapor that reaches the substrate is generally higher than that of the niobium pentoxide vapor. In addition, since the oxygen gas partial pressure resulting from the titanium dioxide decomposition is low, rapid film formation on the substrate is possible even if the power of electron beams applied to the vapor source is low. Preferably, the compositional ratio of titanium dioxide to niobium pentoxide is such that the amount of titanium dioxide (calculated in terms of $TiO_2$) therein is from 30 to 75% by weight, more preferably from 30to 50% by weight, and that of niobium pentoxide (calculated in terms of $Nb_2O_5$) is from 25 to 70% by weight, more preferably from 50 to 70% by weight.

If the composition ratio of niobium pentoxide is larger than 70% by weight, the amount of niobium pentoxide that reaches the substrate increases, and, in addition, the oxygen gas resulting from titanium dioxide decomposition decreases. Below this value, it may be possible to achieve a particularly low light absorption of the antireflection film To prepare the composition for vapor deposition of the invention, the vapor source mixture may be pressed by any suitable conventional method. For example, a pressure of at least 200 kg/cm$^2$ may be used, and the pressing speed can be controlled such that the pressed blocks contain no air gaps therein. The temperature at which the pressed blocks are sintered varies, depending on the compositional ratio of the oxide components of the vapor source composition, but may be in the range of from 1000 to 1400° C. The sintering time may be determined, depending on the sintering temperature, etc., and may be generally in the range of from 1 to 48 hours.

When heated with electron beams, the composition for vapor deposition that comprises titanium dioxide and niobium pentoxide melts and often forms bumps and/or splashes. The splashes of the composition, if formed in the process of forming an antireflection film from the composition, reach the substrates that are being processed into coated products, thereby to cause pin holes, film peeling and defects by the presence of foreign matter. In addition, the splashes lower the properties including the chemical resistance and the heat resistance of the antireflection film formed. To prevent the composition from forming bumps and splashes, it is desirable to add zirconium oxide and/or yttrium oxide to a mixture of titanium dioxide powder and niobium pentoxide powder, and to sinter the resulting mixture into the composition for vapor deposition of the invention. Preferably, the total amount of zirconium oxide (calculated in terms of $ZrO_2$) and/or yttrium oxide (calculated in terms of $Y_2O_3$) to be added is from 3 to 46 parts by weight, more preferably from 10 to 20 parts by weight, relative to 100 parts by weight of the total amount of titanium dioxide and niobium pentoxide.

Regarding its layer configuration, the antireflection film includes a two-layered film of $\lambda/4$-$\lambda/4$ (in this patent application, unless otherwise specified, X is generally in the range of 450 nm to 550 nm. A typical value is 500 nm), and a three-layered film of $\lambda/4$-$\lambda/4$-$\lambda/4$ or $\lambda/4$-$\lambda/2$-$\lambda/4$. Not being limited thereto, the antireflection film may be any other four-layered or multi-layered film. The first low-refraction layer nearest to the substrate may be any of known two-layered equivalent films, three-layered equivalent films or other composite films. Examples of these films are shown in U.S. Pat. No. 5,181,141.

The antireflection film may be of any suitable thickness. In general, the thickness ranges from 300 nm to 1000 nm depending on its configuration and composition content. The thicknesses described in the examples are representative and should not be regarded as limiting.

The substrate of the optical element of the invention is preferably formed of a synthetic resin. For this, for example, methyl methacrylate homopolymers are usable, as well as copolymers of methyl methacrylate and one or more other monomers such as those having an acryl group or a vinyl group, diethylene glycol bisallyl carbonate homopolymers, copolymers of diethylene glycol bisallyl carbonate and one or more other monomers such as those having an acryl group or a vinyl group, sulfur-containing copolymers, halogen-containing copolymers, polycarbonates, polystyrenes, polyvinyl chlorides, unsaturated polyesters, polyethylene terephthalates, polyurethanes, etc.

For forming an antireflection film on such a synthetic resin substrate, it is desirable that a hard coat layer containing an organosilicon polymer is first formed on the surface of the synthetic resin substrate in a method of dipping, spin coating or the like, and thereafter the antireflection film is formed on the hard coat layer. Hard coat layers and their preparation are disclosed in U.S. Pat. No. 6,306,513. For improving the adhesiveness between the synthetic resin substrate and the antireflection film, the scratch resistance, etc., it is desirable to dispose a primer layer between the synthetic resin substrate and the antireflection film or between the hard coat layer formed on the surface of the synthetic resin substrate and the antireflection film. The primer layer may be, for example, a vapor deposition film of silicon oxide or the like. Suitable primer layers are disclosed in U.S. Pat. No. 5,181,141.

The antireflection film may be formed, for example, in the manner described below.

Preferably, silicon dioxide is used for the low-refraction layers of the antireflection film for improving the scratch resistance and the heat resistance; and the high-refraction layers can be formed by heating pellets that are prepared by mixing titanium dioxide ($TiO_2$) powder, niobium pentoxide ($Nb_2O_5$) powder, and optionally zirconium oxide ($ZrO_2$) powder and/or yttrium oxide ($Y_2O_3$) powder, then pressing the resulting mixture and sintering it into pellets, and evaporating it, for example, with electron beams to thereby deposit the resulting vapor onto a substrate. In that manner, the antireflection film is formed on the substrate. Using such sintered material is preferred, as the time for vapor deposition can be shortened.

If desired, the composition for vapor deposition of the invention may further contain any other metal oxides such as $Ta_2O_5$, $Al_2O_3$ and the like as long as they are not detracting from the above-mentioned effects of the composition. Preferably, the total amount of other metal oxides is in the range of 2 to 30 parts by weight based on 100 parts by weight in the composition.

In the method of vapor deposition of the composition for vapor deposition in the invention, for example, the high-refraction layers may be formed by vaporizing the composition by using any method of vacuum evaporation, sputtering, ion plating or the like under ordinary conditions. Concretely, the composition for vapor deposition is vaporized to form a mixed oxide vapor, and the resulting vapor is deposited on a substrate. Preferably, the process of forming the antireflection film is combined with an ion-assisted process. Such ion-assisted processes are described in M. Flindner et al., Society of Vacuum Coasters Albuquerque, N.Mex., USA. p237–241, 1995 as well as in the documents cited therein.

The composition for vapor deposition of the invention can form high-refraction layers even on a synthetic resin substrate which should be kept at low temperatures ranging from 65 to 100° C. during the vapor deposition, and the scratch resistance, the chemical resistance and the heat resistance of the antireflection film thus formed are all good, and, in addition, the heat resistance of the antireflection film decreases little with time.

The composition for vapor deposition of the invention may be used not only as an antireflection film for lenses for spectacles but also for lenses for cameras, monitor displays, windshields for automobiles, and even for optical filters, etc.

EXAMPLES

The invention is described in more detail with reference to the following Examples, which, however, are not intended to restrict the scope of the invention.

Examples 1 to 3, and Comparative Example 1
(Production of Composition For Vapor Deposition)

Titanium dioxide, niobium pentoxide, zirconium oxide and yttrium oxide were mixed in a composition ratio as in Table 1, pressed, and sintered at 1250° C. for 1 hour, to prepare pellets as a composition for vapor deposition.

Using the pellets, a single-layered high-refraction film was formed, having a thickness of ½λ (λ=500 nm) on a flat glass substrate in a mode of vacuum evaporation. According to the test methods mentioned below, the samples were tested for (1) the melt condition of the composition for vapor deposition, (2) the attachment condition of fine particles, (3) the absorbance, (4) the refractivity, and (5) the speed of film formation. The results are given in Table 1.

(1) Melt Condition of Composition For Vapor Deposition:

The melt condition of the composition for vapor deposition during deposition was checked and evaluated according to the following criteria:

UA: Not splashed.
A: Splashed a little.
B: Splashed frequently.
C: Always splashed.

In the context of the present invention, "splashing" is evaluated by the surface condition of the sintered composition, after finishing vapor deposition. In the case of not splashed, the surface condition of the sintered composition is smooth. In the case of splashed, cavities are seen on the surface condition of the sintered composition.

(2) Attachment Condition of Fine Particles:

After vapor deposition, the attachment condition of fine particles on the flat glass substrate by splashing, in vapor deposition was checked and evaluated according to the following criteria:

UA: No fine foreign materials found.
A: 1 to 5 fine foreign materials found.
B: 6 to 10 fine foreign materials found.
C: 11 or more 11 fine foreign materials found.

(3) Absorbance:

The spectral transmittance and the spectral reflectance of the substrate coated with the single-layered ½λ film were measured with a spectrophotometer. From the measured data, the luminous transmittance and the luminous reflectance were obtained. The absorbance was obtained according to a numerical formula, 100%−(luminous transmittance+luminous reflectance).

(4) Refractive Index:

Using a spectrophotometer, the spectral reflectance of the single-layered ½λ film formed on the flat glass substrate was measured. The refractive index of the glass substrate, the distributed data and the measured data were used as input in an optimized program.

(5) Speed of Film Formation:

In the process of forming the single-layered ½λ film, electron beams were applied to the film under the condition mentioned below, and the thickness of the film formed on the glass substrate was measured with a spectrophotometer. The data was divided by the actual time spent for the film formation to obtain the speed of film formation (Å/sec)

Condition For Exposure to Electron Beams:

Electronic gun used: JST-3C made by JEOL Ltd.
Accelerating voltage: 6 kV
Filament current: 190 mA
Initial vacuum degree: $2.0 \times 10^{-5}$ Torr Table 1

TABLE 1

|  | Example 1 | Example 2 | Example 3 | Comparative Example 1 |
| --- | --- | --- | --- | --- |
| Titanium dioxide (parts by weight) | 59.5 | 42.5 | 30.0 | 100.0 |
| Niobium pentoxide (parts by weight) | 25.5 | 42.5 | 55.0 | 0.0 |
| Zirconium oxide (parts by weight) | 10.0 | 10.0 | 10.0 | 0.0 |
| Yttrium oxide (parts by weight) | 5.0 | 5.0 | 5.0 | 0.0 |
| Melt condition | UA | UA | UA | B |
| Attachment condition of fine particles | UA | UA | UA | A |
| Absorbance (%) | 0.5 | 0.34 | 0.43 | 0.44 |
| Refractive index (500 nm) | 2.178 | 2.197 | 2.232 | 2.119 |
| Speed of film formation (Å/sec) | 3.66 | 5.19 | 6.23 | 2.57 |

As in Table 1, Examples 1 to 3 are all superior to Comparative Example 1 with respect to the melt condition, the attachment condition of fine particles, the refractive index and the speed of film formation. Examples 2 and 3 are particularly good with respect to the refractive index and the speed of film formation.

Example 4 (Production of Optical Element with Antireflection Film)

For the synthetic resin to be provided with an antireflection film, a plastic lens (CR-39: substrate A) was prepared that was made of diethylene glycol bisallyl carbonate (99.7% by weight) as a major component and containing a UV absorbent, 2-hydroxy-4-n-octoxybenzophenone (0.03% by weight), and having a refractive index of 1.499.

The plastic lens was dipped in a coating solution containing 80 mol % of colloidal silica and 20 mol % of γ-glycidoxypropyltrimethoxysilane, and cured to form thereon a hard coat layer (having a refractive index of 1.50).

The plastic lens coated with the hard coat layer was heated at 65° C., and a first layer of low refractivity (having a refractive index of 1.46 and a thickness of $0.5\lambda$ ($\lambda=500$ nm)) was formed thereon through vacuum evaporation of $SiO_2$ (at a vacuum degree of $2\times10^{-5}$ Torr). The first layer is nearest to the substrate. Next, a second layer of high refractivity (having a thickness of $0.0502\lambda$) was formed thereon through vapor deposition of the pellets that had been prepared in Example 1, for which the pellets were heated with an electronic gun (current: 180 to 190 mA); and a third layer of low refractivity (having a refractive index of 1.46 and a thickness of $0.0764\lambda$) was formed thereon also through vacuum evaporation of $SiO_2$. With that, a fourth layer of high refractivity (having a thickness of $0.4952\lambda$) was formed thereon through vapor deposition of the pellets that had been prepared in Example 1, for which the pellets were heated with the electronic gun (current: 180 to 190 mA); and a fifth layer of low refractivity (having a refractive index of 1.46 and a thickness of $0.2372\lambda$) was formed thereon also through vacuum evaporation of $SiO_2$, to form an antireflection film. Further, the back of the thus-coated plastic lens was also coated with an antireflection film of the same constitution. Both surfaces of the plastic lens were thus coated with the 5-layered antireflection film.

The antireflection film-coated plastic lens was tested for (6) the scratch resistance, (7) the adhesiveness, (8) the luminous reflectance, (9) the luminous transmittance, (10) the absorbance, (11) the heat resistance and (12) the heat resistance with time, according to the methods mentioned below. The results are given in Table 2.

(6) Scratch Resistance:

The surface of the plastic lens was rubbed with steel wool of #0000 and under a weight of 1 kg being applied thereto. After 10 strokes of rubbing, the surface condition of the lens was checked and evaluated according to the following criteria:
A: Not scratched.
B: Scratched slightly.
C: Much scratched.
D: Coating film peeled.

(7) Adhesiveness:

According to JIS-Z-1522, the surface of the antireflection film-coated plastic lens was cut to have 10×10 cross-cuts, and tested three times for cross-cut peeling with an adhesive tape, Cellotape (a trade name, produced by Nichiban Corp.). The number of the remaining cross-cuts of original 100 cross-cuts was counted.

(8) Luminous Reflectance:

Using a automatic spectrophotometer, U-3410 made by Hitachi, Ltd., the luminous reflectance was measured.

(9) Luminous Transmittance:

Using a spectrophotometer, U-3410 made by Hitachi, Ltd., the luminous transmittance was measured.

(10) Absorbance:

The absorbance was derived from the luminous transmittance of (8) and the luminous reflectance of (9). Concretely, the absorbance is represented by a numerical formula, 100%−(luminous transmittance+luminous reflectance)

(11) Heat Resistance:

Immediately after having been coated with the antireflection film through vapor deposition, the plastic lens was heated in an oven for 1 hour, and checked as to whether it was cracked or not. Concretely, it was heated first at 50° C. over a period of 60 minutes, and the temperature was elevated at intervals of 5° C. (of a duration of 30 minutes for each interval), and the temperature at which it was cracked was read.

(12) Heat Resistance with Time:

The plastic lens was, immediately after having been coated with the antireflection film, exposed to the open air for 2 months, and then heated in an oven for 1 hour and checked as to whether it was cracked or not. Concretely, it was heated first at 50° C. over a period of 60 minutes, and the temperature was elevated at intervals of 5° C. (of a duration of 30 minutes for each interval), and the temperature at which it was cracked was read.

Example 5 (Production of Optical Element with Antireflection Film)

In the same manner as in Example 4, both surfaces of the substrate were coated with a 5-layered antireflection film, for which, however, the pellets that had been prepared in Example 3 and not those prepared in Example 1 were used for forming the 2nd and 4th layers.

The antireflection film-coated plastic lens was tested for the properties (6) to (12) as described above. The results are given in Table 2.

Comparative Example 2 (Production of Optical Element with Antireflection Film)

In the same manner as described in Example 4, both surfaces of the substrate were coated with a 5-layered antireflection film, for which, however, the pellets that had been prepared in Comparative Example 1 and not those prepared in Example 1 were used for forming the 2nd and 4th layers.

The antireflection film-coated plastic lens was tested for the properties (6) to (12) as described above. The results are given in Table 2.

Example 6 (Production of Optical Element with Antireflection Film)

142 parts by weight of an organosilicon compound, γ-glycidoxypropyltrimethoxysilane, were put into a glass container, to which were dropwise added 1.4 parts by weight of 0.01 N hydrochloric acid and 32 parts by weight of water with stirring. After the dropwise addition, this was stirred for 24 hours to obtain a solution of hydrolyzed γ-glycidoxypropyltrimethoxysilane. To the solution, 460 parts by weight of stannic oxide-zirconium oxide composite sol (dispersed in methanol, having a total metal oxide content of 31.5% by weight and having a mean particle size of from 10 to 15 millimicrons) were added, 300 parts by weight of ethyl cellosolve, 0.7 parts by weight of a lubricant, silicone surfactant, and 8 parts by weight of a curing agent, aluminum acetylacetonate. After having been well stirred, this was filtered to prepare a coating solution.

A plastic lens substrate (a plastic lens for spectacles made by Hoya Corporation, EYAS (a trade name) having a refractive index of 1.60) was pretreated with an aqueous alkali solution, and dipped in the coating solution. After having been thus dipped therein, this was taken out at a pulling rate of 20 cm/min. Then, this was heated at 120° C. for 2 hours, to form a hard coat layer.

The plastic lens coated with the hard coat layer was heated at 80° C., and a first layer of low refractivity (having a refractive index of 1.46 and a thickness of $0.47\lambda$ ($\lambda=500$ nm)) was formed thereon through vacuum evaporation of $SiO_2$ (at a pressure of $2\times10^{-5}$ Torr). The first layer is nearest to the substrate. Next, a second layer of high refractivity (having a thickness of 0.0629λ) was formed thereon through vapor deposition of the pellets that had been prepared in Example 1, for which the pellets were heated with an electronic gun (current: 180 to 190 mA); and a third layer of low refractivity (having a refractive index of 1.46 and a thickness of 0.0528λ) was formed thereon also through vacuum evaporation of $SiO_2$. With that, a fourth layer of high refractivity (having a thickness of 0.4432λ) was formed thereon through vapor deposition of the pellets that had been prepared in Example 1, for which the pellets were heated with the electronic gun (current: 180 to 190 mA); and a fifth layer of low refractivity (having a refractive index of 1.46 and a thickness of 0.2370λ) was formed thereon also through vacuum evaporation of $SiO_2$, to an antireflection film. Further, the back of the thus-coated plastic lens was also coated with an antireflection film of the same constitution. Both surfaces of the plastic lens were thus coated with the 5-layered antireflection film.

The antireflection film-coated plastic lens was tested for the properties (6) to (12) as specified above. The results are given in Table 3.

Example 7 (Production of Optical Element with Antireflection Film)

In the same manner as in Example 6, both surfaces of the substrate were coated with a 5-layered antireflection film, for which, however, the pellets that had been prepared in Example 3 and not those prepared in Example 1 were used for forming the 2nd and 4th layers.

The antireflection film-coated plastic lens was tested for the properties (6) to (12) as specified above. The results are given in Table 3.

Comparative Example 3 (Production of Optical element with Antireflection Film)

In the same manner as in Example 6, both surfaces of the substrate were coated with a 5-layered antireflection film, for which, however, the pellets that had been prepared in Comparative Example 1 and not those prepared in Example 1 were used for forming the 2nd and 4th layers.

The antireflection film-coated plastic lens was tested for the properties (6) to (12) as specified above. The results are given in Table 3.

Example 8 (Production of Optical Element with Antireflection Film)

100 parts by weight of an organosilicon compound, γ-glycidoxypropyltrimethoxysilane was put into a glass container, to which were added 1.4 parts by weight of 0.01 N hydrochloric acid and 23 parts by weight of water with stirring. After the addition, this was stirred for 24 hours to obtain a solution of hydrolyzed γ-glycidoxypropyltrimethoxysilane. On the other hand, 200 parts by weight of an inorganic particulate substance, composite sol of particulates made of titanium oxide, zirconium oxide and silicon oxide as major components (dispersed in methanol, having a total solid content of 20% by weight and having a mean particle size of from 5 to 15 nm—in this, the atomic ratio of Ti/Si in the core particles is 10, and the ratio by weight of the shell to the core is 0.25) was mixed with 100 parts by weight of ethyl cellosolve, 0.5 parts by weight of a lubricant, silicone surfactant, and 3.0 parts by weight of a curing agent, aluminum acetylacetonate. The resulting mixture was added to the hydrolyzed γ-glycidoxypropyltrimethoxysilane, and well stirred. This was filtered to prepare a coating solution.

A plastic lens substrate (a plastic lens for spectacles made by Hoya Corporation, Teslalid (a trade name), having a refractive index of 1.71) was pretreated with an aqueous alkali solution, and dipped in the coating solution. After having been thus dipped therein, this was taken out at a pulling rate of 20 cm/min. Then, the plastic lens was heated at 120° C. for 2 hours, to form a hard coat layer.

The plastic lens coated with the hard coat layer was heated at 80° C., and a first layer of low refractivity (having a refractive index of 1.46 and a thickness of 0.069λ (λ=500 nm)) was formed thereon through vacuum evaporation of $SiO_2$ (at a pressure of $2\times10^{-5}$ Torr). The first layer is nearest to the substrate. Next, a second layer of high refractivity (having a thickness of 0.0359λ) was formed thereon through vapor deposition of the pellets that had been prepared in Example 1, for which the pellets were heated with an electronic gun (current: 180 to 190 mA); and a third layer of low refractivity (having a refractive index of 1.46 and a thickness of 0.4987λ) was formed thereon also through vacuum evaporation of $SiO_2$. With that, a fourth layer of high refractivity (having a thickness of 0.0529λ) was formed thereon through vapor deposition of the pellets that had been prepared in Example 1, for which the pellets were heated with the electronic gun (current: 180 to 190 mA); a fifth layer of low refractivity (having a refractive index of 1.46 and a thickness of 0.0553λ) was formed thereon through vacuum evaporation of $SiO_2$; a sixth layer of high refractivity (having a thickness of 0.4560λ) was formed thereon through vapor deposition of the pellets that had been prepared in Example 1, for which the pellets were heated with the electronic gun (current: 180 to 190 mA); and a seventh layer of low refractivity (having a refractive index of 1.46 and a thickness of 0.2422λ) was formed thereon through vacuum evaporation of $SiO_2$, to form an antireflection film. Further, the back of the thus-coated plastic lens was also coated with an antireflection film of the same constitution. Both surfaces of the plastic lens were thus coated with the 7-layered antireflection film.

The antireflection film-coated plastic lens was tested for the properties (6) to (12) as specified above. The results are given in Table 4.

Example 9 (Production of Optical Element with Antireflection Film)

In the same manner as in Example 8, both surfaces of the substrate were coated with a 7-layered antireflection film, for which, however, the pellets that had been prepared in Example 3 and not those prepared in Example 1 were used for forming the 2nd, 4th and 6th layers.

The antireflection film-coated plastic lens was tested for the properties (6) to (12) as specified above. The results are given in Table 4.

Comparative Example 4 (Production of Optical Element with Antireflection Film)

In the same manner as in Example 8, both surfaces of the substrate were coated with a 7-layered antireflection film, for which, however, the pellets that had been prepared in Comparative Example 1 and not those prepared in Example 1 were used for forming the 2nd, 4th and 6th layers.

The antireflection film-coated plastic lens was tested for the properties (6) to (12) as above. The results are given in Table 4.

Table 2

TABLE 2

|  | Example 4 | Example 5 | Comparative Example 2 |
|---|---|---|---|
| Scratch resistance | A | A | C |
| Adhesiveness | 100 | 100 | 100 |
| Luminous transmittance (%) | 98.875 | 99.17 | 98.498 |
| Luminous reflectance (%) | 0.972 | 0.666 | 1.319 |
| Absorbance (%) | 0.153 | 0.164 | 0.183 |
| Heat resistance (° C.) | 80 | 80 | 70 |
| Heat resistance with time (° C.) | 65 | 65 | 50 |

Table 3

TABLE 3

|  | Example 6 | Example 7 | Comparative Example 3 |
|---|---|---|---|
| Scratch resistance | A | A | C |
| Adhesiveness | 100 | 100 | 100 |
| Luminous transmittance (%) | 98.874 | 99.164 | 98.545 |
| Luminous reflectance (%) | 0.937 | 0.648 | 1.284 |
| Absorbance (%) | 0.189 | 0.188 | 0.171 |
| Heat resistance (° C.) | 120 | 120 | 110 |
| Heat resistance with time (° C.) | 105 | 105 | 90 |

Table 4

TABLE 4

|  | Example 8 | Example 9 | Comparative Example 4 |
|---|---|---|---|
| Scratch resistance | A | A | C |
| Adhesiveness | 100 | 100 | 100 |
| Luminous transmittance (%) | 98.885 | 99.153 | 98.663 |
| Luminous reflectance (%) | 0.829 | 0.614 | 1.106 |
| Absorbance (%) | 0.286 | 0.233 | 0.231 |
| Heat resistance (° C.) | 90 | 90 | 85 |
| Heat resistance with time (° C.) | 80 | 80 | 70 |

As in Tables 2 to 4, the antireflection film-coated plastic lenses of Examples 4 to 9, for which the pellets of Example 1 or 3 were used, are better than the antireflection film-coated plastic lenses of Comparative Examples 2 to 4, for which the pellets of Comparative Example 1 were used, in the scratch resistance and the heat resistance, and, in addition, the heat resistance with time of the former lowered little after exposure to the weather, as compared with that of the latter. From the data of the antireflection film-coated plastic lenses of Examples 5, 7 and 9, for which the composition ratio of niobium pentoxide in the pellets of Example 3 was increased, it is understood that the refractivity and also the absorbance of the coated lenses are lowered.

The inventive examples of the present application describe preferred embodiments of the present invention. However, compositions having compositional ratios between the compositions of the examples are also preferred. Similarly, antireflection films having thicknesses between those disclosed in the examples are also preferred. Finally, optical elements, having layer structures between those disclosed in the examples are also preferred.

As described in detail hereinabove, the composition for vapor deposition obtained according to the method of the invention can form a high-refraction layer even on synthetic resin substrates that must be processed at low temperatures for vapor deposition thereon, within a short period of time and without using an ion gun unit or a plasma unit, not detracting from the good physical properties intrinsic to the high-refraction layer formed, that the high-refraction layer formed has high refractivity; and the antireflection film comprising the high-refraction layer formed on such synthetic resin substrates has good scratch resistance, good chemical resistance and good heat resistance, and the heat resistance of the antireflection film decreases little with time.

In addition, the antireflection film-coated optical element obtained according to the method of the invention has good scratch resistance, good chemical resistance and good heat resistance, and its heat resistance decreases little with time. Specifically, the antireflection film that coats the optical element ensures good UV absorption of titanium dioxide therein, and the coated optical element is useful for plastic lenses for spectacles.

What is claimed is:

1. A method for producing a composition, which comprises sintering a vapor source mixture containing titanium dioxide, niobium pentoxide, and additionally contains zirconium oxide and/or yttrium oxide, wherein the amount of titanium dioxide (calculated in terms of $TiO_2$) in the vapor source mixture is from 30 to 75% by weight.

2. The method for producing a composition as claimed in claim 1, wherein the amount of zirconium oxide (calculated in terms of $ZrO_2$) and/or yttrium oxide (calculated in terms of $Y_2O_3$) is from 3 to 46 parts by weight relative to 100 parts by weight of the total amount of titanium dioxide and niobium pentoxide.

3. A composition comprising titanium dioxide, niobium pentoxide, and zirconium oxide and/or yttrium oxide wherein the amount of titanium dioxide is from 30 to 75% by weight.

4. The composition of claim 3, wherein the amount of niobium pentoxide is from 25 to 70% by weight.

5. The composition of claim 4, wherein the amount of zirconium oxide and/or yttrium oxide is from 3 to 46 parts by weight relative to 100 parts by weight of the total amount of titanium dioxide and niobium pentoxide.

6. The composition of claim 5 in sintered form.

7. A method for producing an antireflection film comprising sintering a composition which comprise a vapor source mixture containing titanium dioxide and niobium pentoxide, vaporizing the sintered composition and depositing the generated vapor on a plastic substrate, wherein the amount of titanium dioxide (calculated in term of $TiO_2$) in the vapor source mixture is from 30 to 75% by weight.

8. The method according to claim 7, wherein the plastic substrate has one or more coating layers.

9. The method according to claim 7, which is combined with an ion-assisted process.

10. An antireflection film comprising in an alternating fashion one or more layers of silicon dioxide and one or more layers obtainable according to the method of claim 9.

11. An optical element comprising a hard coat layer on a plastic substrate and an antireflection film of claim 10.

12. An antireflection film comprising in an alternating fashion one or more layers of silicon dioxide and one or more layers obtainable according to the method of claim 7.

13. An optical element comprising a hard coat layer on a plastic substrate and an antireflection film of claim 12.

14. An optical element according to claim 13 selected from a lens for spectacles, lens for a camera, windshield for an automobile, and an optical filter to be fitted to a display of a word processor.

15. The method according to claim 7, wherein the amount of niobium pentoxide (calculated in term of $Nb_2O_5$) is from 25 to 70% by weight.

16. The method according to claim 15, wherein the vapor source mixture additionally contains zirconium oxide and/or yttrium oxide.

17. The method according to claim 16, wherein the amount of zirconium oxide (calculated in term of $ZrO_2$) and/or yttrium oxide (calculated in term of $Y_2O_3$) is from 3 to 46 parts by weight relative to 100 parts by weight of the total amount of titanium dioxide and niobium pentoxide.

18. The method according to claim 17, which is combined with an ion-assisted process.

19. An antireflection film comprising in an alternating fashion one or more layers of silicon dioxide and one or more layers obtainable according to the method of claim 17.

* * * * *

UNITED STATES PATENT AND TRADEMARK OFFICE
CERTIFICATE OF CORRECTION

PATENT NO.    : 6,627,320 B2
DATED         : September 30, 2003
INVENTOR(S)   : Takeshi Mitsuishi et al.

It is certified that error appears in the above-identified patent and that said Letters Patent is hereby corrected as shown below:

<u>Column 12,</u>
Line 54, "term" should read -- terms --.

<u>Column 13,</u>
Line 8, "term" should read -- terms --.

<u>Column 14,</u>
Lines 2 and 3, "term" should read -- terms --.

Signed and Sealed this

Second Day of December, 2003

JAMES E. ROGAN
*Director of the United States Patent and Trademark Office*